(12) United States Patent
Berset et al.

(10) Patent No.: US 7,396,005 B2
(45) Date of Patent: Jul. 8, 2008

(54) CLAMPING DEVICE AND TRANSPORT MECHANISM FOR TRANSPORTING SUBSTRATES

(75) Inventors: Jean-Baptiste Berset, Mueswangen (CH); Martin Deflorin, Oberwil bei Zug (CH); Pascal Menet, Cham (CH)

(73) Assignee: Unaxis International Trading Ltd., Cham (CH)

( * ) Notice: Subject to any disclaimer, the term of this patent is extended or adjusted under 35 U.S.C. 154(b) by 86 days.

(21) Appl. No.: 11/240,870

(22) Filed: Sep. 29, 2005

(65) Prior Publication Data
US 2006/0071385 A1    Apr. 6, 2006

(30) Foreign Application Priority Data
Oct. 1, 2004    (CH)    .................................. 1628/04

(51) Int. Cl.
*B25B 1/16*    (2006.01)
(52) U.S. Cl. ......................................... 269/216; 269/43
(58) Field of Classification Search ................. 269/216, 269/20, 217, 234, 43, 45
See application file for complete search history.

(56) References Cited

U.S. PATENT DOCUMENTS

| | | |
|---|---|---|
| 4,189,230 A | 2/1980 | Zasio |
| 4,643,796 A | 2/1987 | Burns |
| 4,949,943 A | 8/1990 | Bernstein |
| 5,163,222 A | 11/1992 | Imlig et al. |
| 5,197,720 A * | 3/1993 | Renz et al. ................. 269/48.1 |
| 5,931,452 A * | 8/1999 | Nakatomi et al. ........... 269/216 |
| 5,974,654 A | 11/1999 | Morita |
| 6,008,113 A | 12/1999 | Ismail et al. |
| 6,109,602 A * | 8/2000 | Schron et al. ............... 269/216 |
| 2006/0071385 A1 * | 4/2006 | Berset et al. ................ 269/216 |

FOREIGN PATENT DOCUMENTS

| | | |
|---|---|---|
| CH | 679 878 | 4/1992 |
| CH | 689 188 | 11/1998 |
| DE | 32 42 856 | 6/1983 |
| GB | 2 109 996 | 6/1983 |
| SU | 844269 | 7/1981 |

\* cited by examiner

*Primary Examiner*—Lee D Wilson
(74) *Attorney, Agent, or Firm*—Thelen Reid Brown Raysman & Steiner LLP

(57) ABSTRACT

A clamping device contains a clamp jaw fixed in vertical direction, a clamp jaw moveable in vertical direction and a force transducer for applying a force to the moveable clamp jaw. The moveable clamp jaw is curved. The force transducer preferably comprises a coil and an iron core. In the non-clamping condition of the clamping device, the moveable clamp jaw is loaded with the weight of the iron core. For clamping, a current is applied to the coil that produces a magnetic field that presses the iron core against the moveable clamp jaw.

2 Claims, 2 Drawing Sheets

CLAMPING DEVICE AND TRANSPORT MECHANISM FOR TRANSPORTING SUBSTRATES

PRIORITY CLAIM

The present application claims priority under 35 U.S.C. § 119 based upon Swiss Patent Application No. 1628/04 filed on Oct. 1, 2004.

FIELD OF THE INVENTION

The invention concerns a clamping device and a transport mechanism with such a clamping device for transporting substrates.

BACKGROUND OF THE INVENTION

Such a transport mechanism is used for example on a Wire Bonder to transport substrates. A Wire Bonder is a machine with which semiconductor chips are wired by means of pressure, ultrasound and heat after they have been mounted onto a substrate. The transport mechanism comprises two guide rails, at least one clamping device moveable back and forth along the guide rails and at least one holding device. The moveable clamping device serves to transport the substrate in transport direction along the guide rails to the bonding station and away from the bonding station. The holding device serves to hold the substrate between the transport phases. The holding device is for example a rigidly arranged clamping device or a roller resting on the substrate that presses the substrate against the guide rail. The roller contains a special bearing that only allows the roller to turn in one rotational direction and blocks the roller in the opposite rotational direction. The solution with the roller is comparatively expensive and has the disadvantage that movement of the substrate in transport direction is always possible as the roller only makes movement impossible opposite to the transport direction. The rigidly arranged clamping device has the disadvantage that the clamp jaw has to be moved in order to clamp the substrate. The moved clamp jaw is a moved mass that, on impacting on the substrate, transmits a certain energy to the substrate and jolts the substrate. Especially with thin substrates—there are substrates that are only 50 micrometers thick—the vibrations can cause the bond wires of already wired semiconductor chips to deform and, under certain circumstances, neighbouring bond wires to come into contact with each other and produce an electrical short-circuit.

Transport mechanisms with fixed and/or moveable clamping devices are known from EP 330'831, CH 679'878 and CH 689'188.

BRIEF DESCRIPTION OF THE INVENTION

The object of the invention is to develop a clamping device that on clamping does not jolt the substrate.

The construction and function of the clamping device are explained based on an example with which the object to be clamped is a substrate onto which semiconductor chips are mounted. The clamping device contains a clamp jaw fixed in vertical direction, a clamp jaw moveable in vertical direction and a force transducer for applying a force to the moveable clamp jaw. In the non-clamping condition, the force transducer has the task of applying a first, comparatively low force to the moveable clamp jaw so that the moveable clamp jaw is either in contact with the fixed clamp jaw as long as no substrate is inserted between the two clamp jaws, or is in contact with the substrate to be clamped. The moveable clamp jaw is curved so that, with the fixed clamp jaw, it forms a tapered inlet into which the substrate can be inserted without the danger of the substrate catching on the moveable clamp jaw. When the substrate is inserted into the clamping device, then the moveable clamp jaw is deflected to the extent of the thickness of the substrate: It now travels one stroke. In order to clamp the substrate, the force transducer exerts a second, greater force on the moveable clamp jaw. On changing from the non-clamping condition to the clamping condition, the moveable clamp jaw is no longer moved and therefore does not travel a stroke.

With a preferable embodiment, the force transducer comprises an iron core driven by a coil, a so-called solenoid. In the non-clamping condition of the clamping device, the moveable clamp jaw is loaded with the weight of the iron core. For clamping, a current is applied to the coil that produces a magnetic field that presses the iron core against the moveable clamp jaw.

With another embodiment, the force transducer comprises a pneumatically actuated bolt pre-tensioned by means of a spring. The spring presses the bolt against the moveable clamp jaw. To clamp the substrate, pneumatic pressure is additionally applied to the bolt so that the force exerted by the bolt on the moveable clamp jaw is increased.

The clamping device is particularly suited for use in a transport mechanism for transporting substrates in a predetermined transport direction.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale. In the drawings.

DETAILED DESCRIPTION OF THE INVENTION

Figure 1:
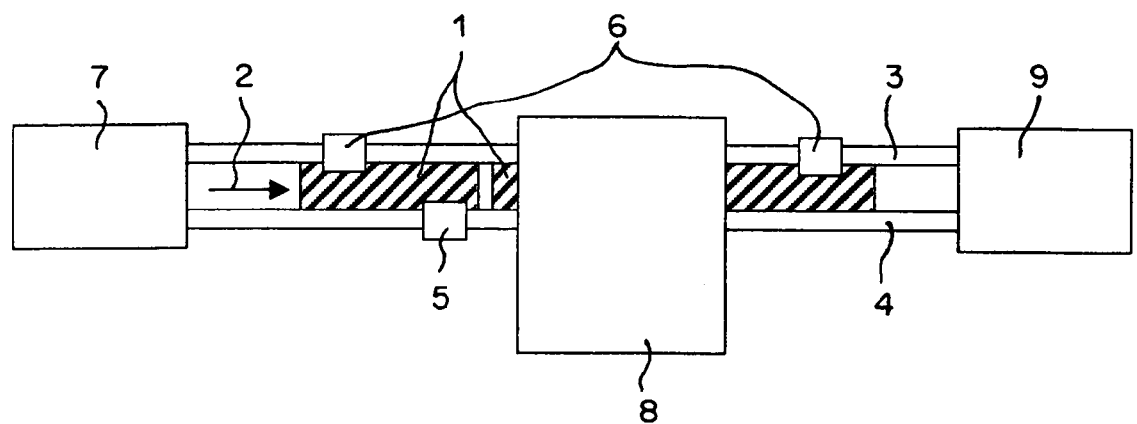
FIGS. 1, 2 show a plan view and a cross-section of a transport mechanism.
Figure 2:
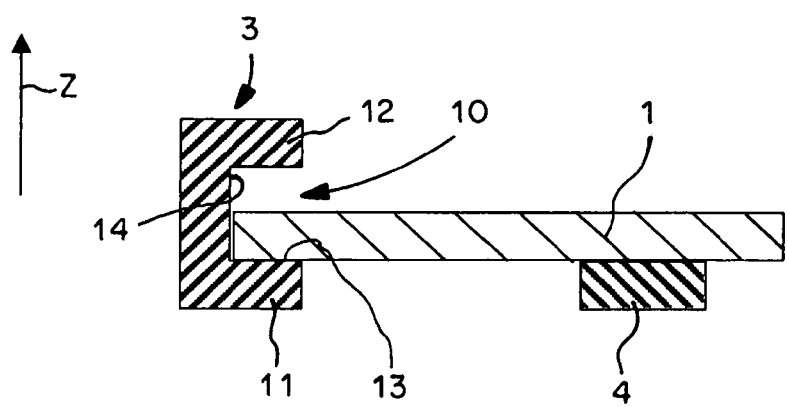

FIGS. 1 and 2 show a plan view and a cross-section of a transport mechanism of a Wire Bonder for transporting substrates 1 in a transport direction 2. The transport mechanism consists of two guide rails 3 and 4 arranged parallel to each other running in the transport direction 2, at least one moveable clamping device 5 and at least one fixed clamping device 6. The moveable clamping device 5 is moveable back and forth in transport direction 2. It serves to transport a substrate 1, for example pushed out of a magazine 7 and presented at the start of the transport section, to a processing station 8 and later from the processing station 8 to the end of the transport section from where the substrate 1 is pushed into a second magazine 9 by means of a pusher. The first guide rail 3 contains a groove 10 comprising an edge 14 bordering the groove 10 and two legs 11 and 12 protruding from the edge 14. The first leg 11 forms a horizontal support surface 13 on which the substrate 1 rests. The edge 14 serves as a stop for guiding and aligning the substrate 1. The second leg 12 forms a border so that the substrate 1 can not disengage from the groove 10. The second leg 12 is not always necessary and can be omitted. The second guide rail 4 serves only as a support for the substrate 1.

The transport mechanism is particularly suitable for use on a Wire Bonder where semiconductor chips mounted on the substrate 1 are wired to the substrate 1 in the processing station 8. In technical jargon the processing station is called a bonding station.

Figure 3:
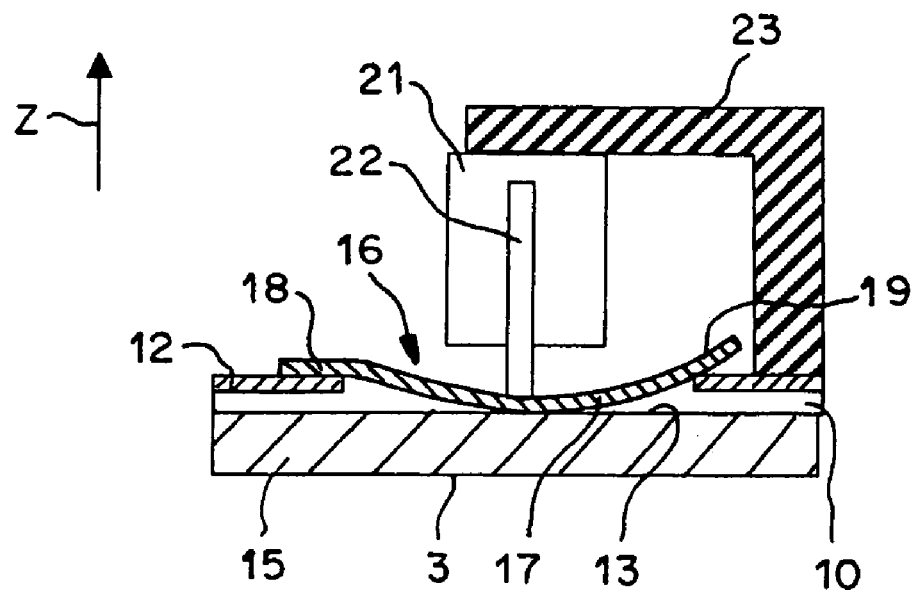
FIG. 3 shows a first embodiment of a clamping device in accordance with the invention.

FIG. 3 shows a side view of an embodiment of a clamping device in accordance with the invention that is rigidly arranged. This embodiment is suitable when the clamping device runs in the vertical direction. The clamping device has a fixed clamp jaw 15 and a moveable clamp jaw 16 moveable in clamp direction that is designated as z direction. The clamp direction runs in vertical direction. The fixed clamp jaw 15 is formed by the support surface 13 of the groove 10 of the guide rail 3. The moveable clamp jaw 16 consists of a curved plate 17. The second leg 12 of the groove 10 is interrupted in the area of the clamping device and replaced by the plate 17. One end 18 of the plate 17 is secured to the second leg 12 at one side of the interruption, the other end 19 of the plate 17 rests on the second leg 12 at the other side of the interruption. The clamping device includes as a force transducer an iron core 22 driven by a coil 21. The coil 21 is attached to the guide rail 3 by means of a mounting 23. The iron core 22 bears in the coil movable in vertical direction (z direction). As a result of its own weight, the iron core 22 lies on the plate 17 and presses the plate 17 onto the support surface 13. This is the condition of the clamping device when no substrate is present. With an alternative solution, the plate 17 is not attached to the guide rail 3 but to the iron core 22.

Figure 4:
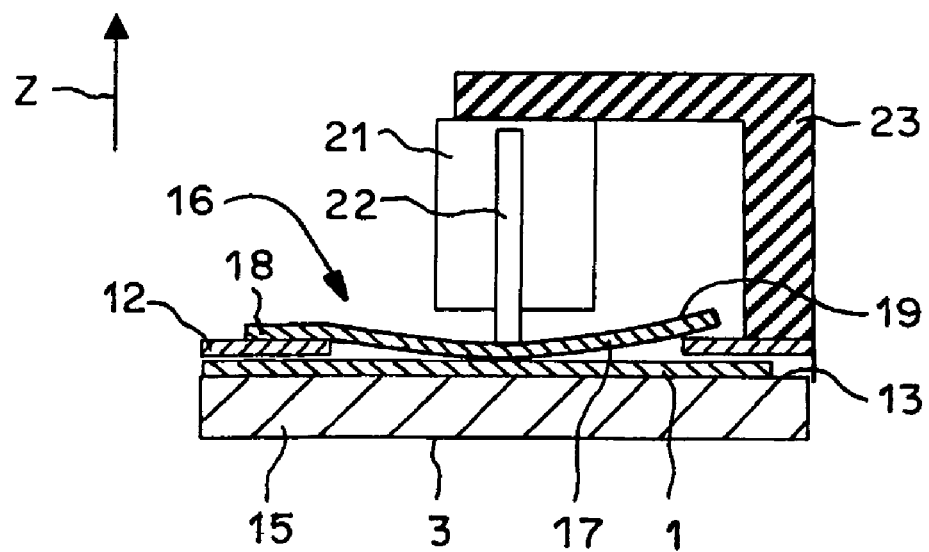
FIG. 4 shows the clamping device in the clamping condition.

When the substrate 1 is transported in transport direction 2 and reaches the clamping device then, on inserting the substrate 1 into the clamping device, the plate 17 and the iron core 22 are moved in z direction. The curved form of the plate 17 forms a tapered inlet and ensures that the substrate 1 does not catch on insertion. The iron core 22 now presses with its own weight against the plate 17 and therefore also against the substrate 1. This condition is shown in FIG. 4. As soon as the transport phase is completed, a current is applied to the coil 21 of the electromagnet. The current flowing through the coil 21 produces a magnetic field that presses the iron core 22 against the plate 17 with a predetermined force. The force exerted by the iron core 22 on the plate 17 is dependent on the strength of the current flowing through the coil 21. The clamping device now firmly clamps the substrate 1. The advantage of the clamping device in accordance with the invention lies in that the clamp jaws 15, 16 do not have to travel a stroke in order to firmly clamp the substrate 1. As soon as the current flowing through the coil 21 is switched off, the force of the clamping device is reduced to that of the own weight of the iron core 22. The substrate 1 can now be transported further by means of the moveable clamping device.

The invention can also be implemented with a clamping device that is moveable back and forth along the guide rail 4. The clamping device is constructed identically to the clamping device explained based on FIGS. 3 and 4 however with the difference that the plate 17 is not attached to the guide rail 4 but to the iron core 22. The clamp jaw 15 is either formed through the guide rail 4 or is attached to the clamping device and in this case moves back and forth with the clamping device.

The force transducer comprising the coil 21 and the iron core 22 can be replaced by a pneumatic force transducer that has a bolt to which pressure can be applied and which is pre-tensioned with a spring. This solution is particularly suited when the clamping device does not run in vertical direction.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A clamping device, comprising:
a first clamp jaw fixed relative to a clamping direction,
a second clamp jaw moveable in the clamping direction, the moveable clamp jaw curved so that the moveable clamp jaw forms a tapered inlet with the fixed clamp jaw, and
a force transducer configured to apply a force to the moveable clamp jaw so that in a non-clamping condition of the clamping device the force transducer exerts a first force on the moveable clamp jaw and thereby urges the moveable clamp jaw against either the fixed clamp jaw or an object to be clamped and that in a clamping condition the force transducer exerts a second force on the moveable clamp jaw that is stronger than the first force, wherein the force transducer comprises a coil and an iron core driven by the coil and wherein in the non-clamping condition of the clamping device the moveable clamp jaw is loaded with the weight of the iron core.

2. A transport mechanism for transporting a substrate in a transport direction, the transport mechansim comprising:
a first and second clamping device, the first clamping device rigidly fixed to the transport mechanism and the second clamping device moveable back and forth in the transport direction, the first and second clamping devices having a first clamp jaw fixed relative to a clamping direction,
a second clamp jaw moveable in the clamping direction, the moveable clamp jaw curved so that the moveable clamp jaw forms a tapered inlet with the fixed clamp jaw, and
a force transducer configured to apply a force to the moveable clamp jaw so that in a non-clamping condition of the clamping device the force transducer exerts a first force on the moveable clamp jaw and thereby urges the moveable clamp jaw against either the fixed clamp jaw or an object to be clamped and that in a clamping condition the force transducer is configured to exert a second force on the moveable clamp jaw that is stronger than the first force, wherein the force transducer comprises a coil and an iron core driven by the coil and wherein in the non-clamping condition of the clamping device the moveable clamp jaw is loaded with the weight of the iron core.

* * * * *